United States Patent [19]
Gotoh

[11] Patent Number: 5,424,641
[45] Date of Patent: Jun. 13, 1995

[54] SQUID FLUXMETER HAVING A PULSE MULLIPLICATION CIRCUIT NUMBER FOR ACCURATELY MEASURING LARGE RATES OF CHANGE IN FLUX

[75] Inventor: Kohtaroh Gotoh, Kawasaki, Japan

[73] Assignee: Fujitsu Limited, Kawasaki, Japan

[21] Appl. No.: 96,401

[22] Filed: Jul. 26, 1993

[30] Foreign Application Priority Data

Jul. 24, 1992 [JP] Japan ................... 4-198308

[51] Int. Cl.⁶ ............... G01R 33/035; H03K 23/76
[52] U.S. Cl. .................................. 324/248; 505/846;
505/830; 327/510; 327/528
[58] Field of Search ............... 324/248; 505/845, 846, 505/830; 307/306

[56] References Cited

U.S. PATENT DOCUMENTS

| | | |
|---|---|---|
| 4,389,612 | 6/1983 | Simmonds et al. ............ 324/248 |
| 4,672,359 | 6/1987 | Silver ........................... 324/248 |
| 4,947,118 | 8/1990 | Fujimaki ...................... 324/248 |
| 5,045,788 | 9/1991 | Hayashi et al. .............. 324/248 |

FOREIGN PATENT DOCUMENTS 63158753 12/1990 Japan ................... 324/248

Primary Examiner—Sandra L. O'Shea
Assistant Examiner—R. Phillips
Attorney, Agent, or Firm—Staas & Halsey

[57] ABSTRACT

A SQUID fluxmeter, which object is to accurately measure magnetic flux even if the input magnetic flux is largely changed in a short time, includes an 1-input superconducting OR gate for outputting pulses to the number of i in response to one input pulse from a SQUID, an AC bias current source for outputting a current $I_C$ of variable frequency 4if to a bias input node of the OR gate, an up/down counter for counting pulses from the SQUID and a control circuit for outputting a control signal $CS_i$ to the AC bias current source corresponding to the time differential value of the count value C1 of the counter and present value i. The response speed of the magnetic flux feedback through the feedback coil to the SQUID in response to the magnetic flux input to the SQUID is thereby made i times higher than that in the prior art.

14 Claims, 9 Drawing Sheets

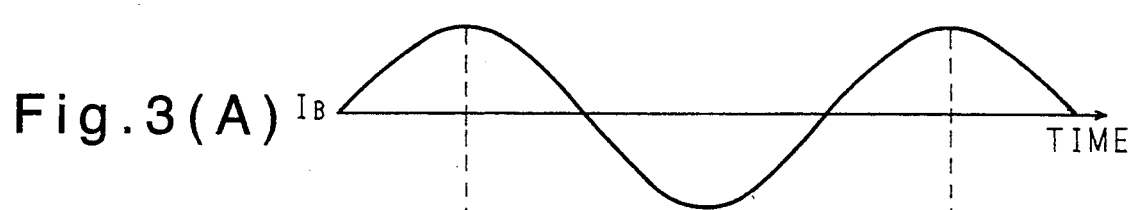
Fig.3(A) $I_B$
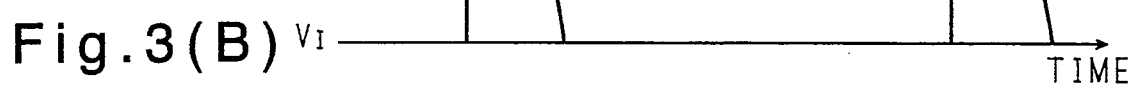
Fig.3(B) $V_I$
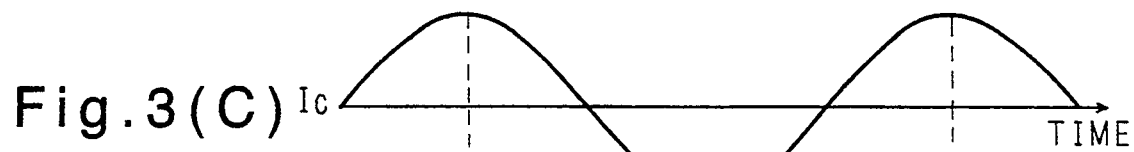
Fig.3(C) $I_C$
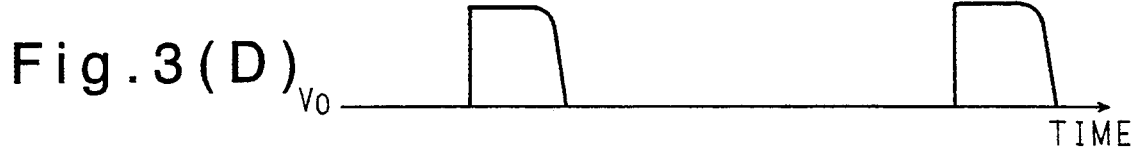
Fig.3(D) $V_O$

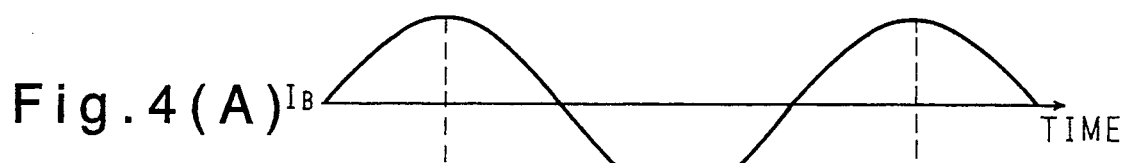
Fig.4(A) $I_B$
Fig.4(B) $V_I$
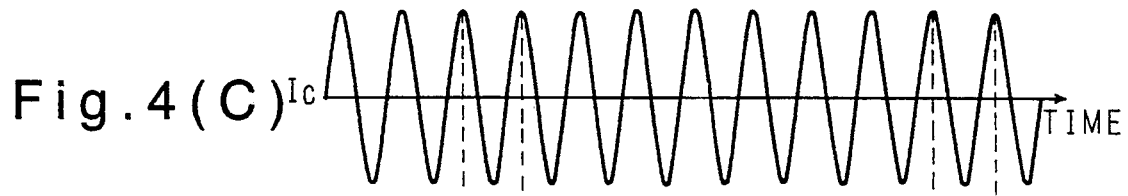
Fig.4(C) $I_C$
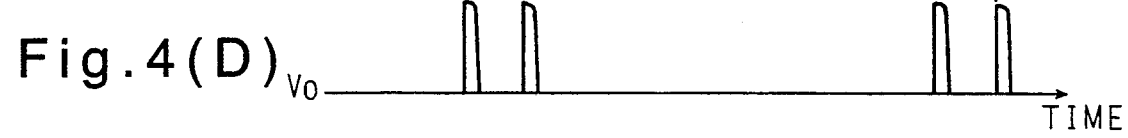
Fig.4(D) $V_O$ FIG.9(A)
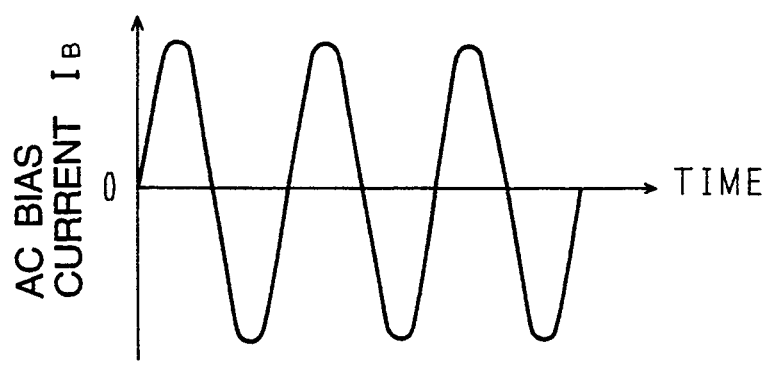
FIG.9(B)
FIG.9(C)
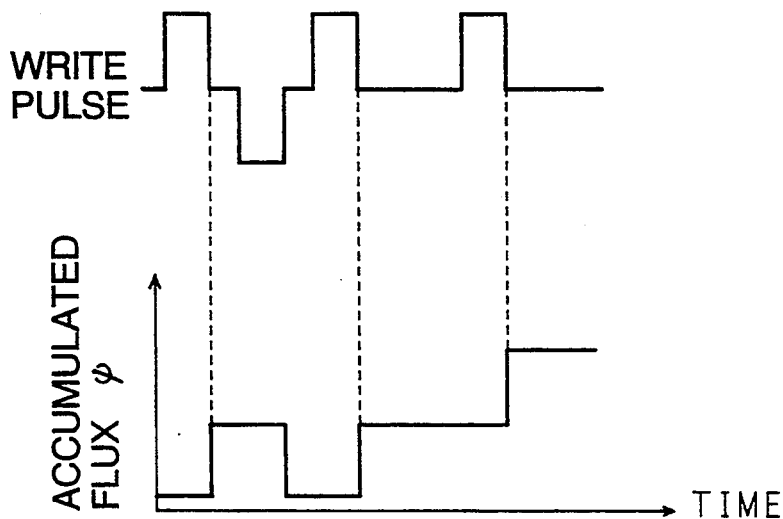

SQUID FLUXMETER HAVING A PULSE MULLIPLICATION CIRCUIT NUMBER FOR ACCURATELY MEASURING LARGE RATES OF CHANGE IN FLUX

BACKGROUND OF THE INVENTION

1. Field of the Invention

The present invention relates to a SQUID (Superconducting Quantum Interference Device) fluxmeter.

2. Description of the Related Art

The SQUID fluxmeter is the most sensitive of all fluxmeters. It is utilized, in particular, for the measurement of magnetic fields emitted from organisms. From the viewpoint of clinical application, there is a demand for a SQUID fluxmeter of higher quality.

FIG. 8 is a circuit diagram showing a conventional SQUID fluxmeter with a built-in superconducting feedback circuit. The SQUID fluxmeter shown consists of a SQUID sensor and a feedback circuit.

The SQUID sensor consists of a pick-up coil 10, a SQUID 12 and an AC bias current source 14.

The pick-up coil 10, which is of a primary differential type adapted to compensate for geomagnetism, is magnetically connected to the SQUID 12. The SQUID 12 consists of a superconducting loop including Josephson devices J1 and J2. The SQUID 12 is supplied with an AC bias current as shown in FIG. 9(A) from the AC bias current source 14.

The feedback circuit consists of a write gate 16 having a SQUID 18 and a magnetic coupling coil 20, a superconducting accumulation loop 22 and a feedback coil 24. One end of the magnetic coupling coil 20 is connected to the output node of the SQUID 12, and the other end thereof is connected to the input node of the SQUID 18. The SQUID 18, the superconducting accumulation loop 22 and the feedback coil 24 are connected together in a loop-like fashion. A feedback magnetic flux is supplied to the SQUID 12 through a feedback coil 24.

In the above-described construction, when the SQUID 12 receives an input magnetic flux through the pick-up coil 10, a write pulse as Shown in FIG. 9(B) is supplied from the SQUID 12 to the magnetic coupling coil 20. At the rise and fall of each write pulse, Josephson junctions J3 and J4 are switched on, respectively, whereby a fluxoid quantum is added to the superconducting accumulation loop 22. By reason of the direction of the fluxoid quantum added to the superconducting accumulation loop 22 in the case of a positive write pulse is reverse to that of a negative write pulse, a magnetic flux $\psi$ as shown in FIG. 9(C) is stored in the superconducting accumulation loop 22, which functions as an up-down counter. A magnetic flux in proportion to the accumulated magnetic flux $\psi$ is supplied to the SQUID 12 through the feedback coil 24 in such a way to cancel the input magnetic flux from the pick-up coil 10, and a voltage pulse train is output from the SQUID 12 until the magnetic flux in the SQUID 12 is reduced to zero.

This pulse train is also supplied to a counter 32 placed on the room-temperature side and counted there, the count value C1 of the counter 32 indicating a measured magnetic flux in the SQUID 12 through the pick-up coil 10.

Such a SQUID fluxmeter can be manufactured in a one-chip structure, exclusive of the AC bias current source 14. Thus, magnetic-flux-distribution measurement is possible with a number of such SQUID fluxmeters arranged. Such a SQUID fluxmeter advantageously leads to a reduction in the number of cables connecting from the circuit on the room-temperature side to the SQUID chips on the low temperature side, thereby reducing the heat flow from the room-temperature side to the low-temperature side. Further, it also leads to a reduction in crosstalk between cables.

However, the above conventional SQUID fluxmeter has a problem in that only a fluxoid quantum at most can be written to the superconducting accumulation loop 22 with respect to each of the positive and negative half-cycles of AC bias current. Since the magnetic flux feedback to the SQUID 12 is the first order lag, the response speed $\Delta\psi \cdot f$ of the magnetic-flux feedback through the feedback coil 24 to the SQUID 12 in response to the input magnetic flux is low, where $\Delta\psi$ is the increase of feedback magnetic flux to the SQUID 12 when one fluxoid quantum is added to the superconducting accumulation loop 22, and f indicates the frequency of the AC bias current.

When the frequency f is made too high so as to increase the response speed, the oscillating current induced to the pick-up coil by the switching of the SQUID 12 in a half-circle of the AC bias current induces back to the pick-up coil 10 in the next half-circle of the AC bias current, with the result that the upper limit of the frequency f is restricted to a value determined by the circuit constants of the SQUID sensor and the pick-up coil. Further, when the unit feedback magnetic flux $\Delta\psi$ is made too large, the quantization noise of the SQUID sensor increases due to the feedback magnetic flux.

Thus, when the input magnetic flux has greatly changed in a short period of time, it is impossible to measure the magnetic flux accurately. Depending upon the object of measurement, it is necessary to increase the response speed at the expense of sensitivity.

SUMMARY OF THE INVENTION

In view of the aforementioned problem of the prior art, it is an object of the present invention to provide a SQUID fluxmeter which is capable of following large change of the input magnetic flux in a short time so as to accurately measure magnetic-flux.

FIG. 1 illustrates the principle and construction of a SQUID fluxmeter of the present invention.

The SQUID fluxmeter in accordance with the present invention comprises: a SQUID 1 having a first Josephson junction J1, a second Josephson junction J2 and a superconducting loop, one end of the first Josephson junction J1 being connected to one end of the second Josephson junction J2 through one part of the superconducting loop, the other end of the first Josephson junction J1 being connected to the other end of t:he second Josephson junction J2 through a remaining part of the superconducting loop; a first AC bias current source 2 for supplying first AC bias current $I_B$ of a frequency f between a first node in the one part and a second node in the remaining part of the superconducting loop of the SQUID 1; a pulse number multiplication circuit 3 for outputting voltage pulses to the number of i in response to one input voltage pulse generated between the first node and the second node, the value i being determined by a control signal CSi, polarity (positive or negative) of the input voltage pulse being the same as or the reverse to polarity of the output voltage pulses; a first counter 4 for counting up the voltage pulses of one polarity from the pulse number multiplication circuit 3 and counting down the voltage pulses of the other polarity from the same, a count value counted by the first counter being output as a measured magnetic flux; a feedback circuit 5 for feeding back to the SQUID a magnetic flux which magnitude is proportional to the count value and which direction is such as to cancel a magnetic flux input to the SQUID 1; and a control circuit 6 for generating the control signal CSi such that the value i increases/decreases in correspondence with a time differential value of the measured magnetic flux increasing/decreasing and supplying the control signal CSi to the pulse number multiplication circuit.

The response speed of the magnetic flux feedback to the SQUID 1 by the feedback circuit 5 in response to the input magnetic flux to the SQUID 1 is a $\Delta\psi \cdot i \cdot f$, where $\Delta\psi$ is the increase of feedback magnetic flux to the SQUID 1 when one pulse is output from the pulse number multiplication circuit 3. The variable i increases in correspondence with the time differential value of the input magnetic flux increasing, so that even if the magnitude of the input magnetic flux has been largely changed in a short time, the feedback magnetic flux can follow it in accordance with that of the input magnetic flux, thereby making it possible to accurately measure the input magnetic flux.

In one form of the above-described invention, for example, as shown in FIG. 2, a SQUID fluxmeter have a SQUID chip placed on low temperature side and an outer circuit placed on a room-temperature side.

The SQUID chip SS comprising: a SQUID 12 having a first Josephson junction J1, a second Josephson junction J2 and a superconducting loop, one end of the first Josephson junction J1 being connected to one end of the second Josephson junction J2 through a part of the superconducting loop, the other end of the first Josephson junction J1 being connected to the other end of the second Josephson junction J2 through a remaining part of the superconducting loop; a superconducting logic gate 26, to which a voltage pulse generated between a first node in the one part and a second node in the remaining part is input as a input voltage pulse, for converting a half-cycle of a AC bias current $I_c$, while the input voltage pulse exists, into output voltage pulses synchronizing with the AC bias current $I_c$, the superconducting logic gate 26 having a bias input node to which the AC bias current $I_C$ is input; a superconducting loop 22 for accumulation; a write gate 16 for adding, in response to one pulse from the superconducting gate 26, a fluxoid quantum which direction corresponds to polarity of the pulse from the superconducting gate into the superconducting loop 22 for accumulation; and a feedback coil 24 for feeding a magnetic flux proportional to that accumulated in the superconducting loop back to the SQUID 12.

While the outer circuit comprises: a first AC bias current source 14 for supplying first AC bias current $I_B$ of a frequency f between the first node in the one part and the second node in the remaining part of the superconducting loop of the SQUID 12; a second AC bias current source 28 for outputting the second AC bias current $I_C$ which frequency is equal to product of a value of natural number i and the frequency f, the value i being determined by a control signal CSi; a counter 34 for counting up the output voltage pulses of one polarity from the superconducting logic gate and counting down the voltage pulses of the other polarity from the same, a count value counted by the counter being output as a measured magnetic flux; and a control circuit 30 for generating the control signal CSi such that the value i increases/decreases in correspondence with a time differential value of the measured magnetic flux increasing/decreasing and supplying the control signal CSi to the second AC bias current source 28.

In further one form of the above-described one form of the invention, for example, as shown in FIG. 7, a SQUID fluxmeter is of multi-channel type. The SQUID chip SS comprising plurality of circuit blocks S1 to SN each of which consists of, as shown in FIG. 2, the SQUID 12, the superconducting logic gate 26, the superconducting loop 22 for accumulation 22, the write gate 16 and the feedback coil 24. While the outer circuit comprises: the first AC bias current source 141 to 14N with respect to the SQUID of each the circuit block; the second AC current source 28 for commonly supplying to each the superconducting logic gates in the circuit block; the counter 341 to 34N for one of the blocks; and the control circuit 30. Each of the circuit blocks S1 to SN may be one SQUID chip.

In the above-described SQUID fluxmeter of multi-channel type, the number of signal lines connecting the outer circuit on the room-temperature side and the multi-channel SQUID chip or chips SS on the low temperature side is larger by one as compared with the prior art, which is due to the output line for the AC bias current source 28, and the influence of the quantity of heat transferred from the room-temperature side to the low temperature side through this signal line is relatively small.

Other features of the present invention will become apparent from the following description taken in connection with the accompanying drawings.

BRIEF DESCRIPTION OF THE DRAWINGS

FIGS. 3(A) to 3(D) are waveform diagrams illustrating the operation of the circuit of FIG. 2;

FIGS. 4(A) to 4(D) are waveform diagrams illustrating the operation of the circuit of FIG. 2;

FIGS. 9(A) to 9(C) are waveform diagrams illustrating the operation of the circuit of FIG. 8.

DETAILED DESCRIPTION OF THE PREFERRED EMBODIMENTS

Figure 1:
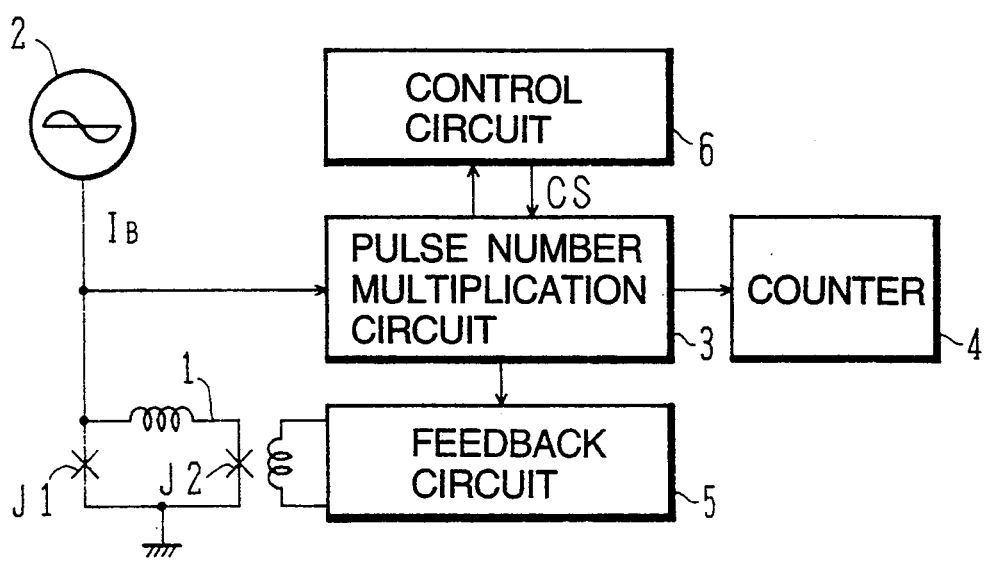
FIG. 1 is a diagram showing the principle and construction of a SQUID fluxmeter according to the present invention.
Figure 2:
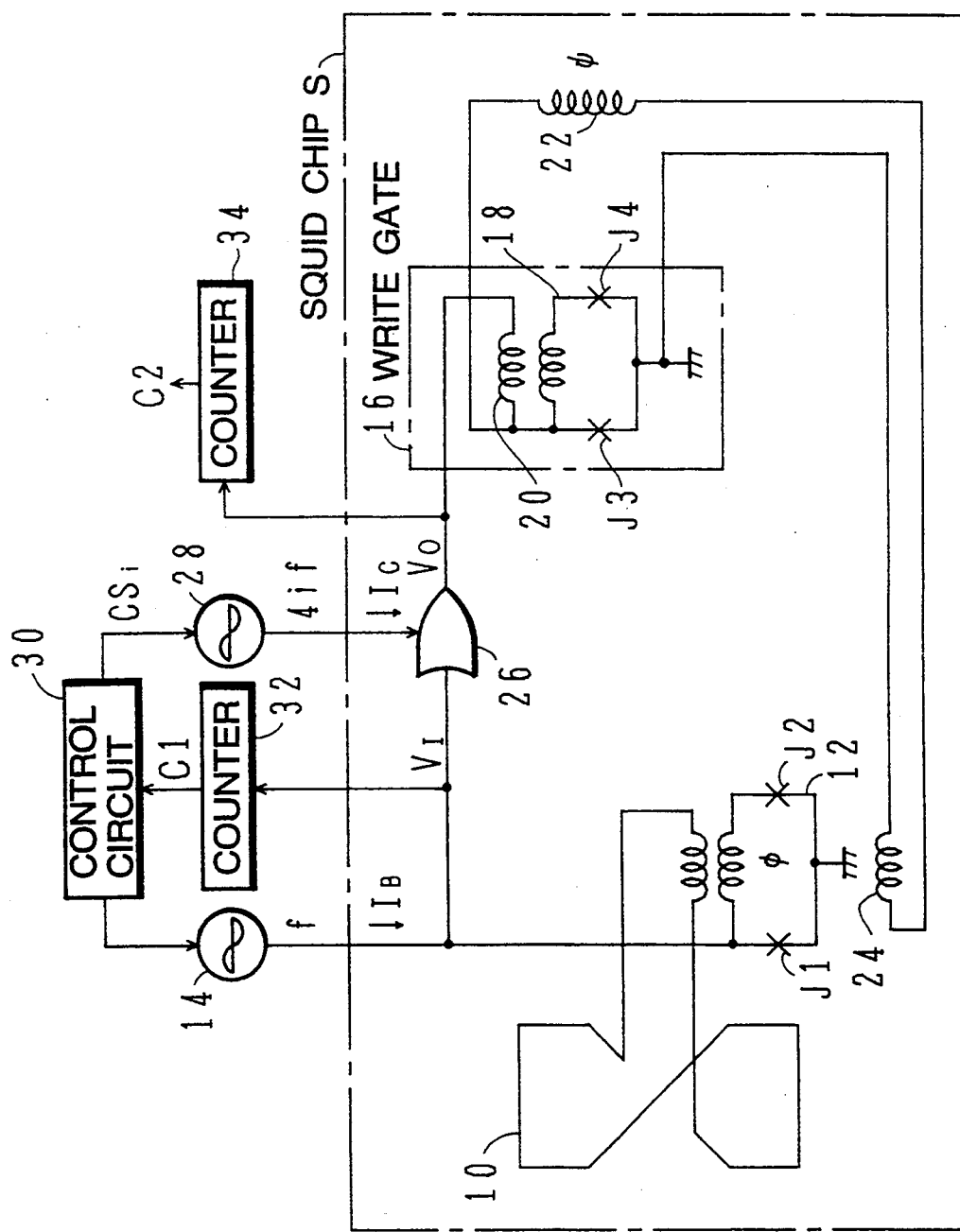
FIG. 2 is a circuit diagram showing a SQUID fluxmeter according to the first embodiment of the present invention.

Now the present invention will be described in detail in connection With the following embodiments.
First Embodiment FIG. 2 shows a SQUID fluxmeter according to the first embodiment of the present invention. The components which are the same as those of FIGS. 8 will be referred to by the same reference numerals, and a description thereof will be omitted.

The SQUID fluxmeter consists of a SQUID chip S and an outer circuit on the room-temperature side. The SQUID chip S includes a well-known 1-input OR gate 26, which is a superconducting gate connected between the voltage output node of a SQUID 12 and the input node of a write gate 16. For example as shown in FIGS. 4(B) to 4(D), while existing an input voltage pulse, the OR gate 26 converts a half-cycle of an AC current $I_C$ which is supplied to the power input node thereof into a voltage pulse if the polarity (positive or negative) of the half-cycle of the AC current $I_C$ is the same as that of the input voltage pulse. Apart from the OR gate 26, the SQUID chip S has the same construction as that of FIG. 8.

The outer circuit on the room-temperature side is constructed as follows: an AC bias current source 14 supplies a current $I_B$ of a fixed frequency f to the bias current input node, which is also voltage output node, of the SQUID 12, and a AC bias current source 28 supplies a current $I_C$ of a variable frequency of 4if to the bias input node of the OR gate 26, where i is a natural number. When i=1, it is exceptionally possible to supply the AC current $I_C$ of the frequency f. In the following, this exceptional case will be described. The AC bias current source 28 consists, for example, of a well-known function generator or a synthesizer having a clock generator, mixer, low-pass filter, PLL and dividing-ratio-variable divider. The control circuit 30 consists, for example, of a microcomputer, which supplies control signals for synchronization between the AC bias currents $I_B$ and $I_C$ to the AC bias current sources 14 and 28, and other control signals described below.

The input voltage $V_I$ and the output voltage $V_O$ of the 1-input OR gate 26 are respectively supplied to counters 32 and 34 placed on the room-temperature side. The counters 32 and 34 are both up-down counters which count values are decreased by a negative input pulse and increased by a positive input pulse. The count value C1 of the counter 32 is supplied to the control circuit 30, which, as described below, supplies a selection control signal CSi to the AC bias current source 28 on the basis of the time differential value $\Delta C1/\Delta t$ of the count value C1 and the value i. In response to this, the AC bias current source 28 outputs a current $I_C$ of a frequency f when i=1, and a frequency 4if when i≧2.

Figure 5:
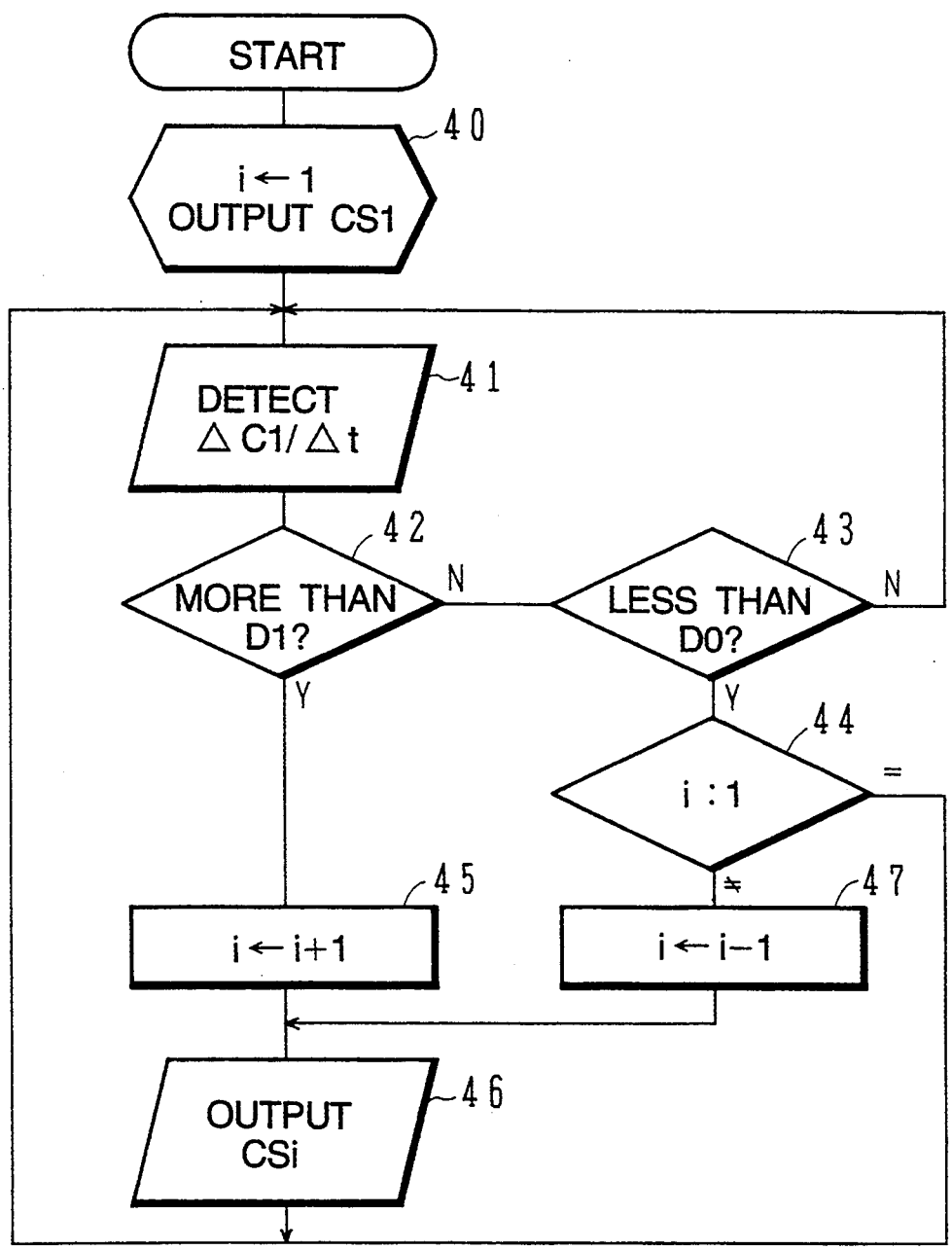
FIG. 5 is a flowchart showing frequency control procedures for an AC current source by a control circuit according to the first embodiment of the present invention.

Next, the frequency control for the AC bias current source 28 by the control circuit 30 will be described with reference to FIG. 5. Hereafter, the numeral in parenthesis indicates the step number in the Figure.

(40) The control circuit 30 substitutes 1 for variable i, and supplies the AC bias current source 28 with the selection control signal CS1, in response to which the AC bias current source 28 outputs a current $I_C$ of the frequency f, whereby the input voltage $V_I$ of the OR gate 26, the AC current $I_C$ and the output voltage $V_O$ of the OR gate 26 become as shown in FIGS. 3(B) to 3(D). FIG. 3(A) shows an AC bias current $I_B$.

Figure 8:
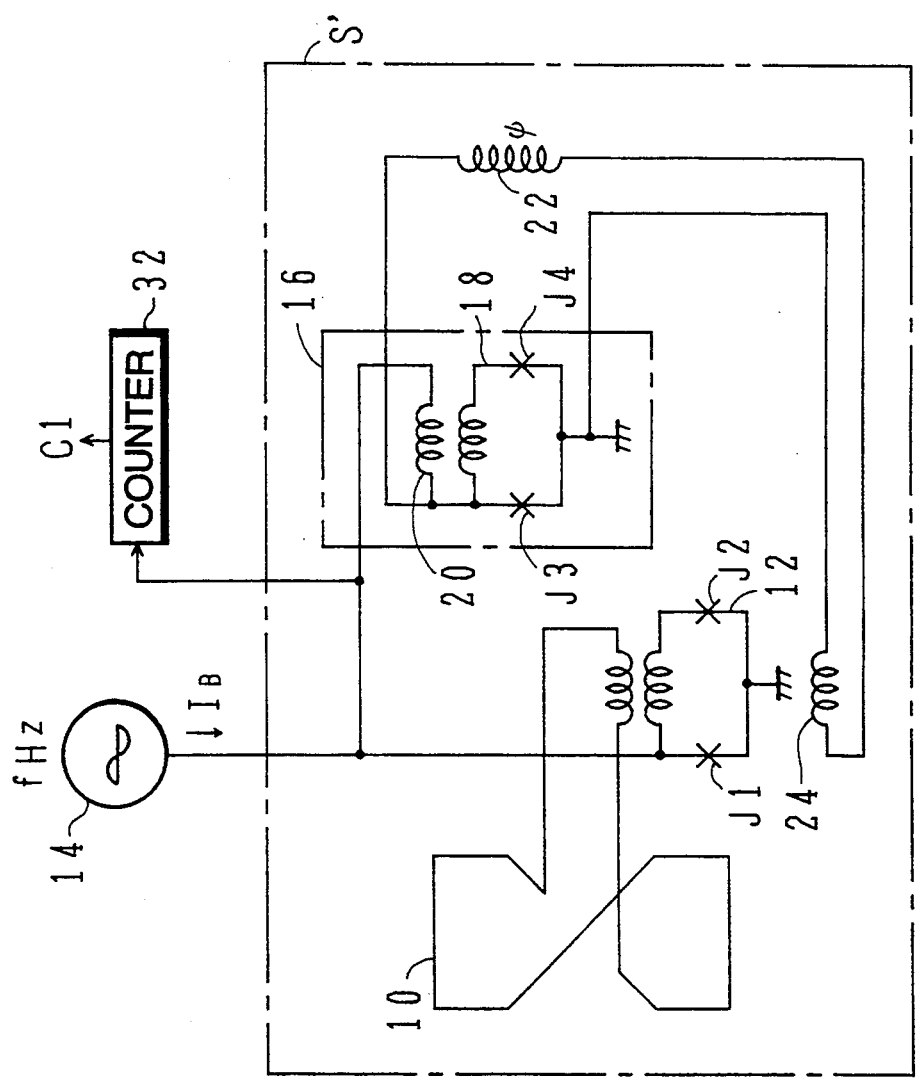
FIG. 8 is a circuit diagram showing a SQUID fluxmeter of a prior art.

In this state, the number of output pulses of the OR gate 26 becomes the same as the number of input pulses, its operation being substantially the same as that of the circuit shown in FIG. 8.

(41) The count value C1(t) of the counter 32 at time t is read into the control circuit 30 and stored in RAM.

From this count value C1(t) and the count value C1(t−$\Delta$t) stored $\Delta$t earlier in the RAM, the time differential value $\Delta C1/\Delta t$ of the count value C1 is calculated. $\Delta$t is, for example, a time corresponding to three cycles of the AC bias current $I_B$. Assuming that the unit of time equal to $\Delta$t, $\Delta C1/\Delta t$ can be obtained only by subtraction.

(42 to 44) The control circuit 30 compares $\Delta C1/\Delta t$ with a set value D1. If $\Delta C1/\Delta t<DO$ and i=1, the procedure returns to step (41). If $DO \leq \Delta C1/\Delta t \leq D1$, the procedure also returns to step (41).

(45, 46) If the change in the magnetic flux input to the SQUID 12 through the pick-up coil 10 becomes so fast that $\Delta C1/\Delta t>D1$, the control circuit 30 increases the variable i by one, supplying a selection control signal CSi to the AC bias current source 28. In response to this, the AC bias current source 28 outputs a current $I_C$ of a frequency 4if, whereby the input voltage $V_I$ of the OR gate 26, the AC current $I_C$ and the output voltage $V_O$ of the OR gate 26 become as shown in FIGS. 4(B) to 4(D) when i=2. FIG. 4(A) shows an AC bias current $I_B$.

In this state, the number of output pulses of the OR gate 26 becomes double the number of input pulses. Generally speaking, when the frequency of the current $I_C$ is 4if, the number of output pulses of the OR gate 26 is i times larger than the number of input pulses thereof.

At the rise and fall of each pulse output from the OR gate 26, the Josephson junctions J3 and J4 of the SQUID 18 respectively undergo switching, thereby adding a fluxoid quantum to the superconducting accumulation loop 22. Therefore, the response speed of the magnetic flux feedback through feedback coil 24 to the SQUID 12 in response to the input magnetic flux is i times higher than that in the case where i=1.

As a result of the increase in variable i by one, the synthesized magnetic flux composed of the input magnetic flux and the feedback magnetic flux is reduced, resulting in a reduction in $\Delta C1/\Delta t$.

Then, the procedure returns to step (41).

(47) $\Delta C1/\Delta t$ decreases, with the result that $\Delta C1/\Delta t<DO$, the variable i is decreased by one if i≠1, the procedure advancing to step (46).

As a result of the above operation, the response speed of the magnetic flux feedback through the feedback coil 24 to the SQUID 12 in response to the input magnetic flux is $\Delta\psi\cdot i\cdot f$, where $\Delta\psi$ is the increase of feedback magnetic flux to the SQUID 12 when one fluxoid quantum is added to the superconducting accumulation loop 22. The variable i increases in correspondence with the time differential value of the input magnetic flux increasing, so that even if the magnitude of the input magnetic flux has been largely changed in a short time, the feedback magnetic flux can follow it in accordance with that of the input magnetic flux, thereby making it possible to accurately measure the input magnetic flux.

The count value C2 of the counter 34 is proportional to the accumulated magnetic flux $\psi$ and the feedback magnetic flux, and represents the magnetic flux detected by the pick-up coil 10.

Second Embodiment

Next, a SQUID fluxmeter according to the second embodiment of the present invention will be described.

The second embodiment has the same hardware construction as that Of the first embodiment except that, in FIG. 2, the count value of the counter 34 is supplied to the control circuit 30 without using the counter 32.

Figure 6:
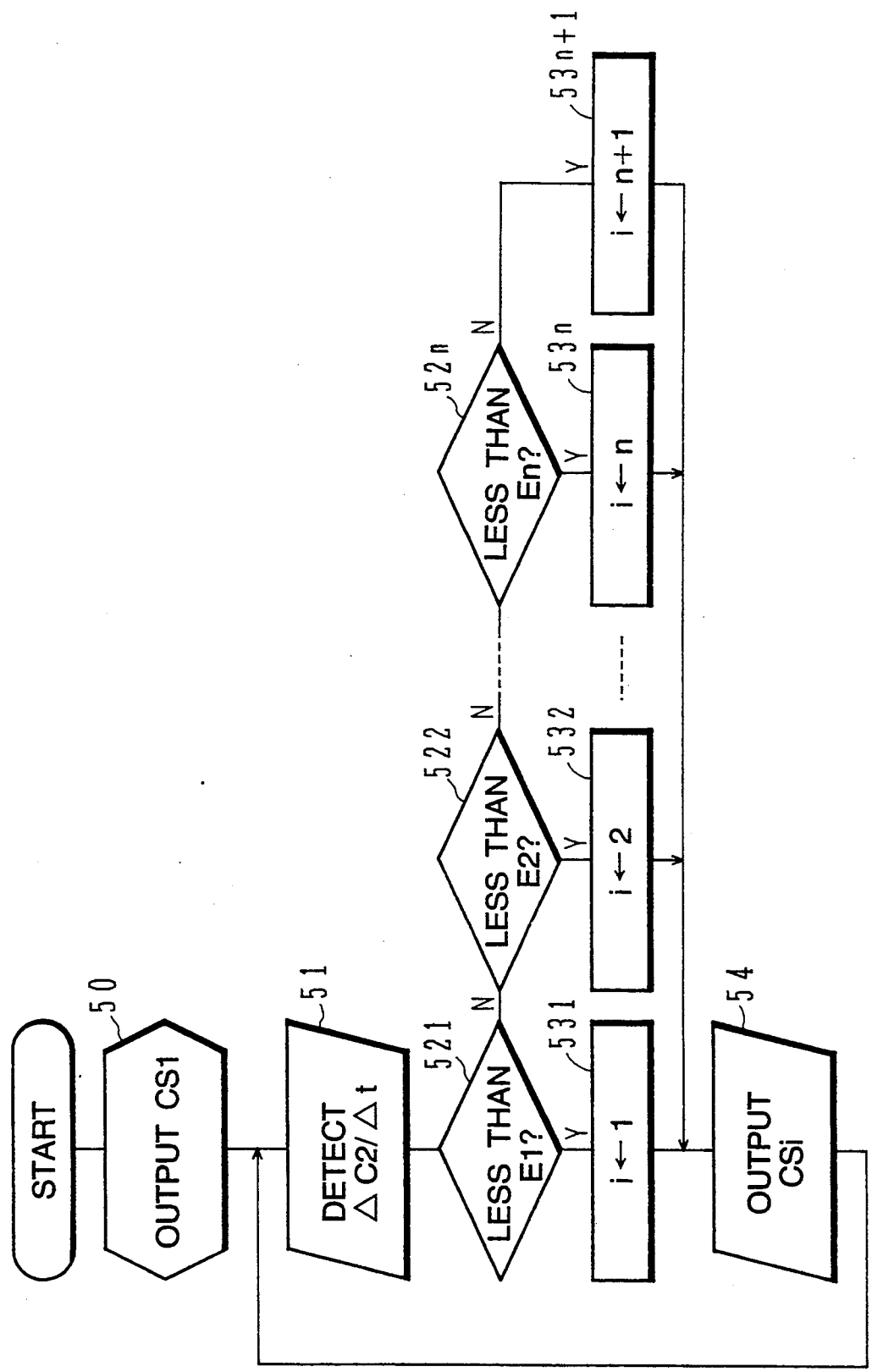
FIG. 6 is a flowchart showing frequency control procedures for an AC current source by a control circuit according to the second embodiment of the present invention.

The frequency control for the AC bias current source 28 by the control circuit 30 will be described with reference to FIG. 6.

(50) The control circuit 30 supplies the selection control signal CS1 to the AC bias current source 28. In response to this, the AC bias current source 28 outputs a current $I_C$ of a frequency f.

(51) The count value C2(t) of the counter 34 at time t is read into the control circuit 30 and stored in RAM. From this count value C2(t) and the count value C2(t−Δt) stored in the RAM Δt earlier, the time differential value ΔC2/Δt of the count value C2 is calculated. As stated above, the count value C2 represents the magnetic flux in the pick-up coil 10, so the ΔC2/Δt represents the rate of change of the detected magnetic flux with respect to time.

(521 to 52n, 531 to 53n) A judgment is made as to that ΔC2/Δt exists in which of ranges grouped by set values E1, E2, . . . , En, where E1<E2< . . . <En. If ΔC2/Δt<E1, then i=1; if Ek−1≦ΔC2/Δt<Ek with respect to a value of k which satisfies the condition 2≦k≦n, then i=k; and if ΔC2/Δt≧En, then i=n+1.

(54) The control circuit 30 supplies the selection control signal CSi to the AC bias current source 28. In response to this, the AC bias current source 28 outputs a current $I_C$ of a frequency 4if if i≧2 and a frequency f if i=1.

As a result of the above operation, the response speed of the magnetic flux feedback through the feedback coil 24 to the SQUID 12 in response to the input magnetic flux is Δψ·i·f. The variable i increases in correspondence with the time differential value of the input magnetic flux increasing, so that even if the magnitude of the input magnetic flux has been largely changed in a short time, the feedback magnetic flux can follow it in accordance with that of the input magnetic flux, thereby making it possible to accurately measure the input magnetic flux.

Third Embodiment

Figure 7:
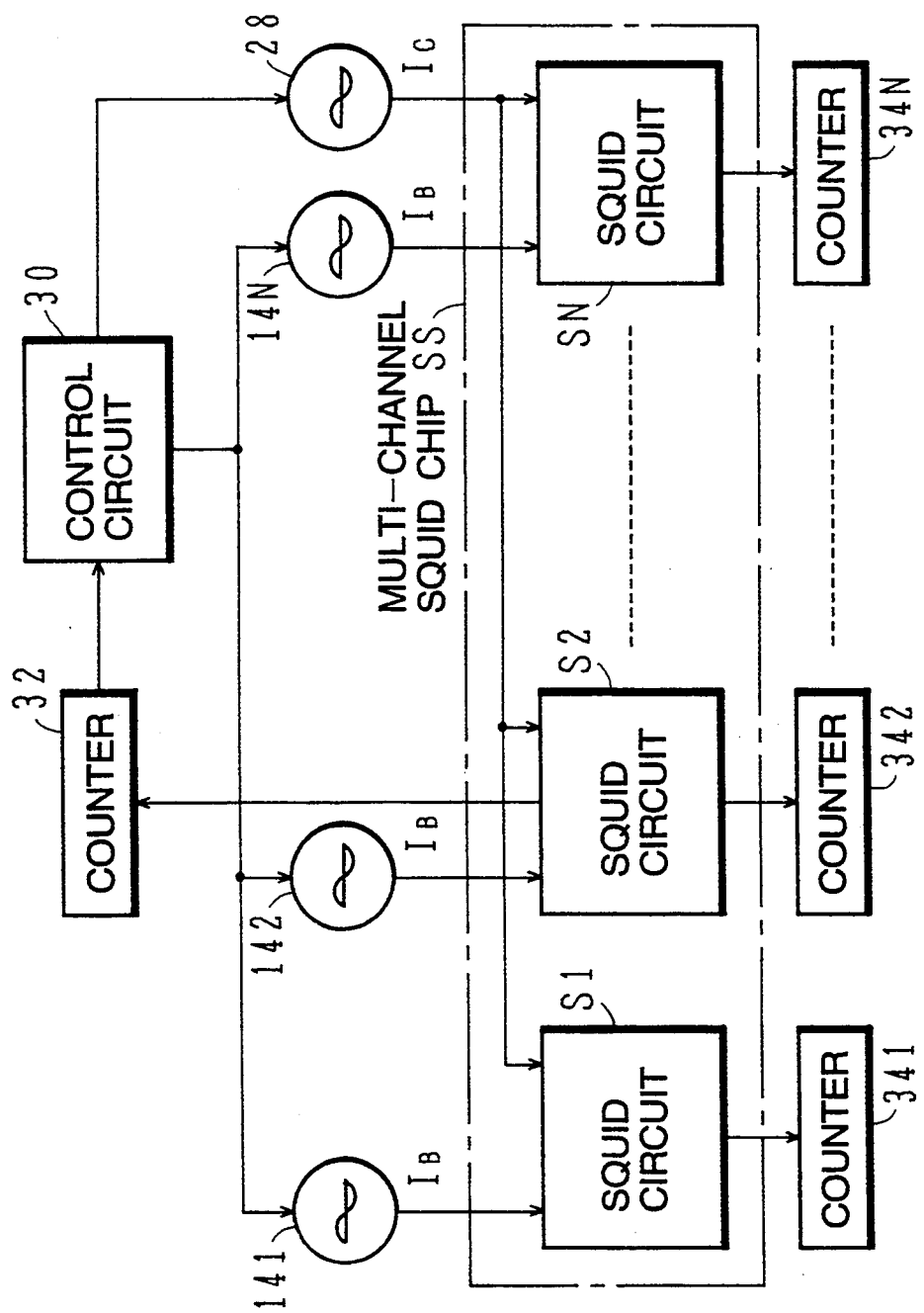
FIG. 7 is a circuit diagram showing a SQUID fluxmeter according to the third embodiment of the present invention.

FIG. 7 shows a SQUID fluxmeter according to the third embodiment of the present invention.

In this SQUID fluxmeter, a multi-channel SQUID chip or chips SS has/have N SQUID superconducting circuit blocks or chips S1, S2, . . . , SN, each SQUID superconducting circuit block or chip being the same as the whole circuit in the SQUID chip S shown in FIG. 2.

The SQUID circuit blocks S1 to SN are respectively connected to the AC bias current source 141 to 14N each of which is the same as the AC bias current source 14 shown in FIG. 2 and counter 341 to 34N each of which is the same as the counter 34 shown in FIG. 2, each connection being the same as that shown in FIG. 2. The SQUID circuit blocks or chips S1 to SN are connected to the AC bias current source 28 with the variable frequency, each connection being the same as that shown in FIG. 2.

The input terminal of the OR gate 26, shown in FIG. 2, of one of the SQUID circuit blocks or chips S1 to SN, for example, S2, is connected to the clock input terminal of the counter 32. The control circuit 30 controls variable frequency of the AC bias current source 28 according to the count value from counter 32 and present value i in such a way described above in the first embodiment.

The reason for providing each of the AC bias current sources 141 to 14N with respect to each of the SQUID circuit blocks or chips S1 through SN is that fine adjustment for the amplitude of the AC bias current can be done in accordance with dispersion in characteristics among the SQUID sensors. While the AC bias current source 28 can be used commonly for the SQUID circuit blocks or chips S1 to SN because the operation margin of the OR gate 26, in FIG. 2, of each of the SQUID circuit blocks or chips S1 to SN is rather wide compared with the SQUID sensor.

In this third embodiment, the number of signal lines connecting the circuit on the room-temperature side and the multi-channel SQUID chip or chips SS on the low temperature side is larger by one as compared with the prior art, which is due to the output line for the AC bias current source 28, and the influence of the quantity of heat transferred from the room-temperature side to the low temperature side through this signal line is relatively small.

The present invention may be embodied in still other ways without departing from the spirit or essential character thereof.

For instance, in the first embodiment, the count value C1 of the counter 32 can be obtained from the count value C2 of the counter 34 and the value of i, so that a construction in which the counter 32 is omitted may also be adopted.

Further, the output of the AC bias current source 28 may be a current $I_C = I_0\{1 - \sin(2\pi ft)\}$ having the same polarity. In this case, the 1-input OR gate 28 may be the one which outputs a voltage pulse while an input voltage pulse exists, the output voltage pulse being in synchronism with the current $I_C$ and polarity of the output voltage pulse being the same as or the reverse of that of an input voltage pulse to the 1-input OR gate 26. Thereby, it is possible for the output frequency of the AC bias current source 28 to be 2if, which is half the one mentioned above.

Also, the 1-input OR gate 26, which construction is preferably simpler than other logic gates, may be replaced by other logic gate having the same function as the 1-input 0R gate 26 described above.

Further, it is possible to use, instead of the write gate 16 and the superconducting loop 22, the counter 34 an A/D converter converting the count value C2 of the counter 34 into an analog current and supplying this current to the feedback coil 24. The construction of the feedback circuit in this invention can be one selected from the various conventional constructions (e.g., Japanese Patent Laid-Open No. 63-290979 and 64-21378).

Further, the pick-up coil 10 is not needed if the SQUID fluxmeter is used in a geomagnetism-shielded space.

What is claimed is:

1. A SQUID fluxmeter comprising:
   a SQUID having a first Josephson junction, a second Josephson junction and a superconducting loop, a first end of said first Josephson junction being connected to a first end of said second Josephson junction through one part of said superconducting loop, a second end of said first Josephson junction being connected to a second end of said second Josephson junction through a remaining part of said superconducting loop;
   a first AC bias current source for supplying a first AC bias current $I_B$ of a frequency f between a first node in said one part of said superconducting loop and a second node in said remaining part of said superconducting loop of said SQUID;

a pulse number multiplication circuit outputting voltage pulses to the number of i in response to an input voltage pulse generated between said first node and said second node, said value i being determined by a control signal CSi, a polarity of said input voltage pulse being the same as or the reverse to a polarity of said output voltage pulses;

a first counter counting up said voltage pulses of a first polarity from said pulse number multiplication circuit and counting down said voltage pulses of a reverse polarity to the first polarity from the pulse number multiplication circuit, a count value counted by said first counter being output as a measured magnetic flux;

a feedback circuit feeding back to said SQUID a magnetic flux having a magnitude proportional to said count value and having a direction such as to cancel a magnetic flux input to said SQUID; and a control circuit generating said control signal CSi such that said value i increases/decreases in correspondence with a time differential value of said measured magnetic flux increasing/decreasing and supplying said control signal CSi to said pulse number multiplication circuit.

2. A SQUID fluxmeter according to claim 1, wherein said pulse number multiplication circuit comprises:

a second AC bias current source outputting a second AC bias current $I_C$ having a frequency equal to a product of said value i and said frequency f, said value i being determined by said control signal CSi; and a superconducting logic gate, to which said voltage pulse from said SQUID is input as art input voltage pulse, for converting a half-cycle of said second AC bias current $I_C$ while said input voltage pulse exists, into said output voltage pulses synchronized with said second AC bias current $I_C$, said superconducting logic gate having a bias input node to which said second AC bias current $I_C$ is input.

3. A SQUID fluxmeter according to claim 2, wherein said control circuit comprises:

a second counter counting up said voltage pulses of a first polarity from said SQUID and counting down said voltage pulses of a reverse polarity to the first polarity from said SQUID, means for detecting a rate of change with respect to time, $\Delta C2/\Delta t$, of a count number C2 of said second counter; and means for generating said control signal CSi corresponding to said rate of change $\Delta C2/\Delta t$ and said value i.

4. A SQUID fluxmeter according to claim 3, wherein said control signal generating means comprises:

means for generating said control signal CSi for initially setting said value i to 1;

means for generating said control signal CSi for increasing said value i if said rate of change $\Delta C2/\Delta t$ is larger than a set value D1; and means for generating said control signal CSi for decreasing said value i if said rate of change $\Delta C2/\Delta t$ is smaller than a set value DO and said value i is not equal to 1, where DO<D1.

5. A SQUID fluxmeter according to claim 2, wherein said control circuit comprises:

means for detecting a rate of change with respect to time, $\Delta C/\Delta t$, of a count number C2 of said first counter; and means for generating said control signal CSi corresponding to said rate, change $\Delta C2/\Delta t$.

6. A SQUID fluxmeter according to claim 5, wherein said control signal generating means comprises:

means for judging whether said rate of change $\Delta C2/\Delta t$ exists in which of range grouped by set values E1, E2, ..., En, where E1<E2< ... En; and means for generating said control signal CSi for setting said value i as follow: if $\Delta C2/\Delta t$<E1, then i=1; if Ek−1≦$\Delta C2/\Delta t$<Ek with respect to a value k which satisfies the condition 2≦k≦n, then i=k; and if $\Delta C2/\Delta t$≧En, then i=n+1.

7. A SQUID fluxmeter according to claim 2, wherein said second AC bias current source outputs said AC bias current $I_C$ having a time average value of zero, and wherein said superconducting gate converts a half-cycle of said second AC bias current $I_C$, while said input voltage pulse exists, into said output voltage pulses if polarity of said half-cycle is one of the same as and reverse to that of said input voltage pulse.

8. A SQUID fluxmeter according to claim 7, wherein said second AC bias current source outputs said second AC bias current $I_C$ of a frequency f when i=1 and a frequency 4if when i≧2.

9. A SQUID fluxmeter according to claim 8, wherein said second AC bias current Z source outputs said second AC bias current $I_c$ having a minimum value of zero, and wherein said superconducting gate converts a half-cycle of said second AC bias current $I_C$, while said input voltage pulse exists, into said output voltage pulses having a polarity which is one of the same as and reverse to that of said input voltage pulse.

10. A SQUID fluxmeter according to claim 9, wherein said second AC bias current source outputs said second AC bias current $I_C$ of a frequency f when i=1 and a frequency 2if when i≧2.

11. A SQUID fluxmeter according to claim 2, wherein said feedback circuit comprises:

a superconducting loop for accumulation;

a write gate adding, in response to one pulse from said superconducting gate, a fluxoid quantum having a direction corresponding to a polarity of said pulse from said superconducting gate into said superconducting loop; and a feedback coil feeding a magnetic flux proportional to that accumulated in said superconducting loop back to said SQUID.

12. A SQUID fluxmeter having a SQUID chip placed on a low temperature side and an outer circuit placed on a room-temperature side, said SQUID chip comprising:

a SQUID having a first Josephson junction, a second Josephson junction and a superconducting loop, a first end of said first Josephson junction being connected to a first end of said second Josephson junction through one part of said superconducting loop, a second end of said first Josephson junction being connected to a second end of said second Josephson junction through a remaining part of said superconducting loop;

a superconducting logic gate, to which a voltage pulse generated between a first node in said one pan and a second node in said remaining part is input as an input voltage pulse, for converting a half-cycle of an AC bias current $I_C$, while said input voltage pulse exists, into output voltage pulses synchronized with said AC bias current $I_C$, said superconducting logic gate having a bias input node to which said AC bias current $I_C$ is input;

a superconducting loop for accumulation;

a write gate adding, in response to one pulse from said superconducting gate, a fluxoid quantum having a direction corresponding to a polarity of said pulse from said accumulation; and a feedback coil feeding a magnetic flux proportional to that accumulated in said superconducting loop back to said SQUID, said outer circuit comprising:

- a first AC bias current source supplying a first AC bias current $I_B$ having a frequency f between said first node in said one part and said second node in said remaining part of said superconducting loop of said SQUID;
- a second AC bias current source outputting said second AC bias current $I_C$ having a frequency equal to a product of a value of a natural number i and said frequency f, said value i being determined by a control signal CSi;
- a counter counting up said output voltage pulses of a first polarity from said superconducting logic gate :and counting down said voltage pulses of a polarity reverse to the first polarity from said superconducting logic gate, a count value counted by said counter being output as a measured magnetic flux; and
- a control circuit generating said control signal CSi such that said value i increases/decreases in correspondence with a time differential value of said measured magnetic flux increasing/decreasing and supplying said control signal CSi to said second AC bias current source.

13. A SQUID fluxmeter according to claim 11, wherein said SQUID chip comprises a plurality of circuit blocks each of which consists of said SQUID, said superconducting logic gate, said superconducting loop for accumulation, said write gate and said feedback coil, and wherein said outer circuit comprises: said first AC bias current source with respect to said SQUID of each said circuit block; said second AC current source commonly supplying to each said superconducting logic gates in said circuit block; said counter for one of said circuit blocks; and said control circuit.

14. A SQUID fluxmeter according to claim 11, wherein said outer circuit comprises: said first AC bias circuit source with respect to said SQUID of each of said SQUID chip; said second AC current source commonly supplying to each said superconducting logic gates in said SQUID chip; said counter for one of said SQUID chip; and said control circuit.

* * * * *

UNITED STATES PATENT AND TRADEMARK OFFICE
CERTIFICATE OF CORRECTION

PATENT NO. : 5,424,641
DATED : June 13, 1995
INVENTOR(S) : Gotoh

It is certified that error appears in the above-indentified patent and that said Letters Patent is hereby corrected as shown below:

Title page:
Item [54]  line 1, after "PULSE" insert --NUMBER--;
           line 2, change "MULLIPLICATION" to --MULTIPLICATION--, delete "NUMBER".
Col. 1, line 1, after "PULSE" insert --NUMBER--;
        line 2, change "MULLIPLICATION" to --MULTIPLICATION--, delete "NUMBER".
        line 8, delete "1.";
        line 12, delete "2."
Col. 9, line 36, after "IC", insert --,--.
Col. 10, line 2, after "rate" delete ",".
Col. 11, line 28, after "gate" delete ":".

Signed and Sealed this

Fifteenth Day of August, 1995

Attest:

BRUCE LEHMAN

*Attesting Officer*      *Commissioner of Patents and Trademarks*